(12) United States Patent
Blonigan et al.

(10) Patent No.: US 6,881,276 B2
(45) Date of Patent: Apr. 19, 2005

(54) DETECTING THE ENDPOINT OF A CHAMBER CLEANING

(75) Inventors: Wendell T. Blonigan, Union City, CA (US); James T. Gardner, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/393,311

(22) Filed: Mar. 18, 2003

(65) Prior Publication Data

US 2003/0159711 A1 Aug. 28, 2003

Related U.S. Application Data (62) Division of application No. 08/904,432, filed on Aug. 1, 1997, now Pat. No. 6,534,007.

(51) Int. Cl.[7] .............................................. B08B 7/04
(52) U.S. Cl. ...................... 134/18; 134/1.1; 134/22.1; 438/905
(58) Field of Search ............................ 134/18, 22.1, 1, 134/1.1, 1.2, 1.3, 902; 422/62; 438/905; 156/345.25; 250/578.1

(56) References Cited

U.S. PATENT DOCUMENTS

| | | | | | |
|---|---|---|---|---|---|
| 4,491,499 | A | * | 1/1985 | Jerde et al. | 216/60 |
| 5,169,402 | A | * | 12/1992 | Elloy | 606/85 |
| 5,348,614 | A | * | 9/1994 | Jerbic | 438/9 |

OTHER PUBLICATIONS

Grill, Cold Plasma in Materials Fabrication, IEEE Press, pp. 162 and 231, 1994.*

* cited by examiner

Primary Examiner—Alexander Markoff
(74) Attorney, Agent, or Firm—Robert J. Stern (57) ABSTRACT

A method and apparatus for cleaning a CVD chamber including optoelectronic detection of the completion or endpoint of the cleaning procedure once a ratio of emission lines reaches a threshold value. The method comprises the steps of: providing a plasma of a cleaning gas into the chamber and creating a plasma from the cleaning gas. The intensity of emission lines of the cleaning gas and of at least one background gas in the chamber are monitored. A ratio of the intensity of the cleaning gas emission line to the intensity of the background gas emission line is determined and monitored as a function of time. The determined ratio is compared to a preset threshold calibration value. The flow of gas is controlled based on the comparing step. The apparatus includes a cleaning gas supply with a valved inlet providing an entrance to the interior of the chamber for passing cleaning gas to the interior of the chamber. A detector having an optical input is disposed for sensing the electromagnetic radiation. The detector has a first channel for detecting a relative intensity of an emission line corresponding to the cleaning gas and a second channel for detecting a relative intensity of the emission line corresponding to the background gases. Software or circuitry is employed to determine a normalized signal using a signal from the first channel and a signal from the second channel. The value of the normalized signal is substantially invariant with respect to simultaneous corresponding changes in the intensity of the signal measured by the first channel and the intensity of the signal measured by the second channel.

24 Claims, 6 Drawing Sheets

DETECTING THE ENDPOINT OF A CHAMBER CLEANING

CROSS REFERENCE TO RELATED APPLICATION

This patent application is a divisional of application Ser. No. 08/904,432 filed Aug. 1, 1997, now U.S. Pat. No. 6,534,007.

BACKGROUND OF THE INVENTION

The present invention relates generally to chemical vapor deposition (CVD) processing, and more particularly to a method and apparatus for CVD chamber cleaning.

CVD is widely used in the semiconductor industry to deposit films of various kinds, such as intrinsic and doped amorphous silicon (a-Si), silicon oxide ($Si_xO_y$), silicon nitride ($Si_rN_s$), silicon oxynitride, and the like on a substrate. Modern semiconductor CVD processing is generally done in a vacuum chamber by using precursor gases which dissociate and react to form the desired film. In order to deposit films at low temperatures and relatively high deposition rates, a plasma can be formed from the precursor gases in the chamber during the deposition. Such processes are known as plasma-enhanced CVD processes or PECVD.

State of the art CVD semiconductor processing chambers are made of aluminum and include a support for the substrate and a port for entry of the required precursor gases. When a plasma is used, the gas inlet and/or the substrate support is connected to a source of power, such as a radio frequency (RF) power source. A vacuum pump is also connected to the chamber to control the pressure in the chamber and to remove the various gases and particulates generated during the deposition.

In all semiconductor processing, particulates in the chamber must be kept to a minimum. Particulates are formed because, during the deposition process, the film is deposited not only on the substrate, but also on walls and various fixtures, e.g., shields, the substrate support and the like in the chamber. During subsequent depositions, the film on the walls, etc., can crack or peel, causing contaminant particles to fall on the substrate. This causes problems and damage to particular devices on the substrate. Damaged devices have to be discarded.

When large glass substrates, e.g., of sizes up to 360 mm×450 mm or even larger, are processed to form thin film transistors for use as computer screens and the like, more than a million transistors may be formed on a single substrate. The presence of contaminates in the processing chamber is even more serious in this case, since the computer screen and the like will be inoperative if damaged by particulates. In this case, an entire large glass substrate may have to be discarded.

Thus, the CVD chamber must be periodically cleaned to remove accumulated films from prior depositions. Cleaning is generally done by passing an etch gas, particularly a fluorine-containing gas, such as nitrogen trifluoride ($NF_3$), into the chamber. A standard method of performing this cleaning procedure is to pass a constant flow of $NF_3$ into the chamber. A plasma is initiated from the fluorine-containing gas which reacts with coatings from prior depositions on the chamber walls and fixtures, e.g., coatings of a-Si, $Si_xO_y$, $Si_rN_s$, SiON and the like, as well as any other materials in the chamber. In particular, the $NF_3$ creates free fluorine radicals "F*" which react with Si-containing residues.

The reaction forms gaseous fluorine-containing volatile products that can be pumped away through the chamber exhaust system. This procedure is generally followed by a nitrogen purge.

As the volatiles are pumped away, the F* contribution to the overall pressure stays low until there are no residues left with which the F* can react. Then the F* contribution to the overall pressure, and thus the overall pressure itself, rises. One can use this rise to detect the endpoint of the cleaning procedure by monitoring the overall pressure with a manometer and waiting for a user-defined endpoint pressure to be reached.

This technique is vulnerable to, e.g., variations in the manometer pressure reading over time, i.e., "manometer pressure drift". Such variations are inherent in any such instrument and may be typically provided for with appropriate calibration techniques. If the variation is such that the manometer drifts low, the process may not seem to attain the endpoint. In this situation, the cleaning recipe is carried out indefinitely, or until a preset time is reached, termed a "recipe timeout". Even though the chamber is cleaned, throughput is reduced and cost increased, the latter especially because $NF_3$ is significantly more expensive than that of any other process gas. Flowing a large and constant amount of $NF_3$ is costly and inefficient.

On the other hand, if the manometer drifts high, the preset pressure may be attained prior to endpoint, resulting in an incomplete clean. Residues may be left in the chamber that are a potential source of contaminant particles.

One way to conserve $NF_3$ is to install a governor on the valve inlet of the $NF_3$. The governor allows $NF_3$ flow in such a manner as to keep the pressure of $NF_3$ constant within the chamber. In this way, the flow rate is no longer constant, decreasing near the endpoint and saving costly $NF_3$. A drawback of this solution is that the endpoint of the cleaning procedure cannot be detected using the rise of the $NF_3$ level, since its pressure is by design constant.

SUMMARY OF THE INVENTION

In one aspect, the invention is directed to a method for cleaning a processing chamber including optoelectronic detection of the completion or endpoint of the cleaning procedure once a ratio of emission lines reaches a threshold value. The method comprises the following steps. A plasma of a cleaning gas is provided in the chamber. The intensity of emission lines of at least one cleaning gas and of the background emission in the chamber are monitored. A ratio of the intensity of the cleaning gas emission line to the intensity of the background emission is determined and monitored over a period of time. The determined ratio is compared to a preset threshold calibration value. The flow of cleaning gas is controlled based on the comparing step.

In another aspect, the plasma of the cleaning gas at least partially dissociates a portion of the molecules of the cleaning gas. The emission line intensity of a constituent of the partially dissociated cleaning gas may be monitored and used in a ratio as above.

Implementations of the invention may include one or more of the following. The chamber may be a CVD chamber. The cleaning gas may be $NF_3$ with a partial pressure in a range of about 0.1 and 2.0 Torr, and more particularly about 1.0 Torr. The constituent of the partially dissociated cleaning gas may include fluorine. The cleaning gas emission line monitored may be at about 704 nanometers. The intensity of emission of the background gas may correspond to the intensity of emission of a plurality of background gases as measured through a neutral density filter. The controlling step may include steps of starting a preset delay period based on the comparing step, and controlling the flow of gas after the end of the preset delay period. The preset delay period may be implemented in hardware or software or both.

In another aspect, the invention is directed to a cleaning system for a processing chamber, comprising a cleaning gas supply with a valved inlet providing an entrance to the interior of the chamber for passing a cleaning gas to the interior of the chamber. A detector having an optical input is used to sense electromagnetic radiation in the interior of the chamber. The detector has a first channel for detecting a relative intensity of an emission line corresponding to a constituent of the cleaning gas and a second channel for detecting a relative intensity of an emission line corresponding to the background gases. A means is employed to determine a normalized signal using a signal from the first channel and a signal from the second channel. The value of the normalized signal is substantially invariant with respect to simultaneous corresponding changes in the intensity of the signal measured by the first channel and the intensity of the signal measured by the second channel.

Implementations of the invention may include the following. The system may further comprise a neutral density filter for filtering an input to the second channel such that the second channel measures the relative intensity of emission lines of an aggregation of the background gases. The means may be software or circuitry or both. The system may further comprise a timer which institutes a preset delay period. The timer may be instituted in hardware or software or both. The detector may be disposed on the exterior of the chamber to monitor radiation in the interior of the chamber through a transparent view port, or may be directly placed in the interior of the chamber.

In another aspect, the invention is directed to a method for cleaning a processing chamber including optoelectronic detection of the completion or endpoint of the cleaning procedure once a ratio of emission lines reaches a threshold value. The method includes the following steps. A plasma of a cleaning gas is provided in the chamber. The intensity of emission lines of the cleaning gas and of at least one background gas in the chamber are monitored. A normalized signal is determined using the intensity of the emission line of the cleaning gas and the intensity of emission of the background gas, such that the value of the normalized signal is substantially invariant with respect to simultaneous corresponding changes in the background gas and cleaning gas signal intensities. The normalized signal is monitored over a period of time. The normalized signal is compared to a preset threshold value. The flow of gas is controlled based on the comparing step.

An advantage of the invention is that a significantly reduced amount of cleaning gas is necessary to clean a chamber because only the amount of $NF_3$ actually necessary to clean the chamber is used. Less waste of costly $NF_3$ occurs because real-time monitoring of the cleaning is employed. It is another advantage that the endpoint of a chamber cleaning can be determined. For at least these reasons, the cleaning process is less costly than prior methods. Finally, problems with manometer drift and recipe timeout are substantially eliminated.

BRIEF DESCRIPTION OF THE DRAWINGS

Like reference numbers and designations in the various drawings indicate like elements.

DETAILED DESCRIPTION

U.S. Pat. No. 5,366,585, issued Nov. 22, 1994 to Robertson et al., entitled "Method and Apparatus for Protection of Conductive Surfaces in a Plasma Processing Reactor", assigned to the assignee of the present invention, and incorporated herein by reference, discloses a PECVD chamber with which the present invention may be used. Of course, the invention is applicable to numerous other types of CVD devices as well as devices for other deposition methods.

Figure 1:
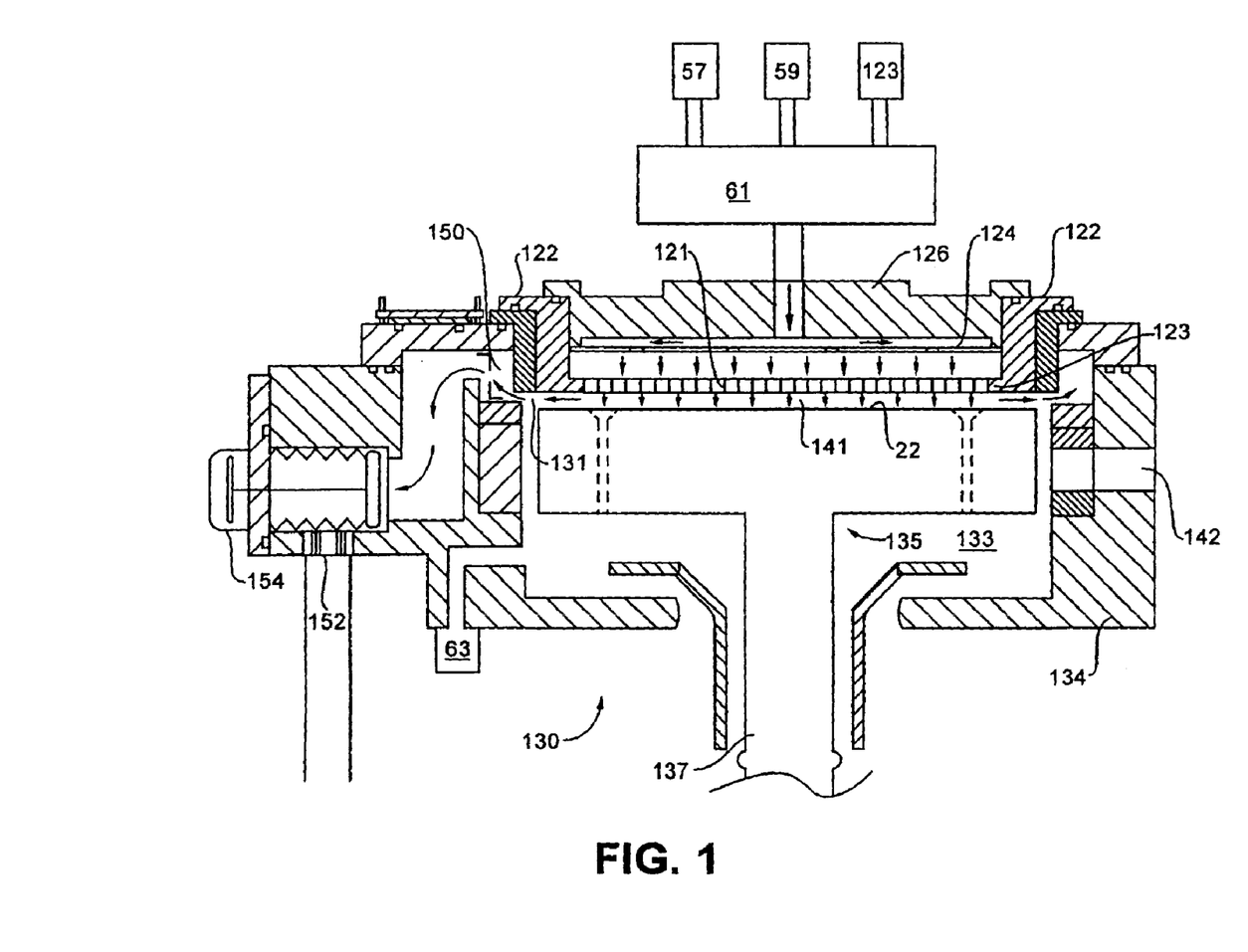
FIG. 1 is a cross-sectional plan view of a PECVD chamber, useful for depositing thin films on a substrate, which may be used in accordance with an embodiment of the present invention.

As shown in FIG. 1, a PECVD apparatus 130 includes a susceptor 135 having a stem 137. Susceptor 135 is centered within a vacuum deposition process chamber 133. Susceptor 135 holds a substrate such as a glass panel (not shown) in a substrate processing or reaction region 141. A lift mechanism (not shown) is provided to raise and lower the susceptor 135. Commands to the lift mechanism are provided by a controller. Substrates are transferred into and out of chamber 133 through an opening 142 in a sidewall 134 of the chamber 133 by a robot blade (not shown).

The deposition process gases flow into chamber 133 through a manifold 61 and an inlet 126. The gases then flow through a perforated blocker plate 124 and a number of holes 121 in a process gas distribution face plate 122 (indicated by small arrows in the substrate processing region 141 of FIG. 1). An RF power supply (not shown) may be used to apply electrical power between gas distribution face plate 122 and susceptor 135 so as to excite the process gas mixture to form a plasma. The constituents of the plasma react to deposit a desired film on the surface of the substrate on susceptor 135.

The deposition process gases may be exhausted from the chamber through a slot-shaped orifice 131 surrounding substrate processing region 141 into an exhaust plenum 150. From exhaust plenum 150, the gases flow by a vacuum shut-off valve 154 and into an exhaust outlet 152 which connects to an external vacuum pump (not shown).

A manometer 63 measures the total pressure of gases in chamber 133. Of course, manometer 63 could be replaced by numerous other types of sensors for total pressure with equally good results. As an example, an ion gauge could be used.

Figure 2:
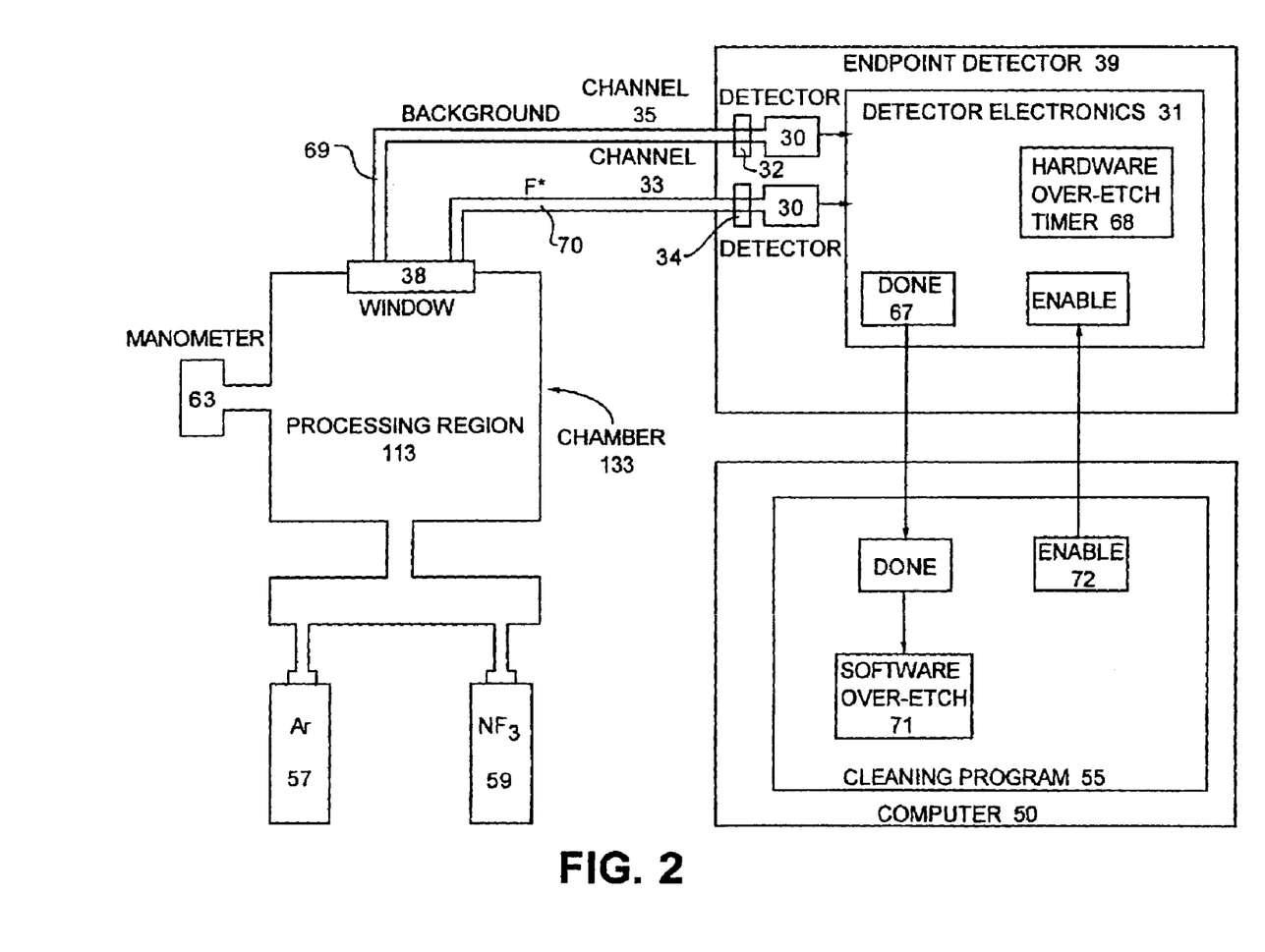
FIG. 2 is a block diagram of an apparatus implementing a cleaning method of the present invention.

Referring to FIG. 2, chamber 133 has at least an $NF_3$ gas supply 59. Other gas supplies may also be used depending on the circumstances of the process. For example, FIG. 2 also shows an argon (Ar) supply 57.

An optoelectronic endpoint detector 39 is provided which views the interior of chamber 113 through a window 38. A first channel 33 having a first F* fiber 70 is used to detect the intensity of light emission at a fluorine emission line F* by filtering the chamber emission through a filter 34. That is, like any atomic or molecular species, fluorine only absorbs and emits radiation at certain wavelengths. When a photon is emitted or absorbed, its energy corresponds to the difference between two permitted values of the energy of the atoms or molecules of the species. The energy levels may be studied by observing the differences between them. Each such difference corresponds to an "emission line." The emission lines for any given species vary greatly in intensity.

One characteristic emission of F* is at 704 nanometers (nm). The level of this emission may be continuously monitored with a photodetector which converts light intensity to an electrical signal. When the F* is reacting with the prior depositions (i.e., being consumed), the 704 nm emission intensity is low. When the prior depositions have been removed by cleaning, the F* emission level rises because there are few residues left with which the F* may react. The rise of F* thus denotes the end of the cleaning procedure, or rather its "endpoint."

The endpoint detector also has a second channel 35, including background fiber 69, for monitoring the total background light emission. Prior to or just after exiting fibers 69 and 70, the light is passed through an appropriate filter so that either the F* emission is measured or the background emission is measured. The background light emission may be filtered with a broadband neutral density filter 32. Filter 32 enables the second channel to measure background gas contributions that may be present at many different wavelengths, not just one wavelength in particular. That is, this type of filter includes contributions over a wide range of wavelengths. Fibers 69 and 70 transmit light signals from window 38 through filters 32 and 34 to a pair of standard photodetectors 30. After measurement by photodetectors 30, signals are sent corresponding to the amount of light intensity of either F* or the background.

A normalized signal may be constructed by optoelectronically dividing the F* emission by the background emission using firmware and circuitry on a printed circuit board. Of course, the printed circuit board and associated circuitry could be replaced by software to perform the same functions.

The division described above is not the only workable algorithm. For example, subtraction or numerous other arithmetic functions could be performed on the signals to result in a normalized signal which could be used to monitor the endpoint. A requirement of this normalized signal is that its value should be substantially invariant with respect to simultaneous corresponding changes in the intensity of the signals measured by the first and second channels. For example, if the F* emission signal intensity and the background emission signal intensity both decrease due to deposition on the window facing the photodetectors or due to varying levels of applied RF power, the normalized signal value may stay substantially the same.

Detector electronics 31 monitors this normalized signal in real time and determines when the normalized signal matches a threshold calibration signal obtained from a clean reference chamber.

Once the normalized signal has found this endpoint by matching the threshold signal, the consistency of the endpoint can be checked by a user-selected "hardware over-etch" timer 68. Hardware over-etch timer 68 institutes a waiting period in detector electronics 31 during which the value of the normalized signal is monitored and checked to ensure that it continues to exceed the calibration value. Hardware over-etch timer 68 serves to "desensitize" the endpoint to chamber fluctuations or anomalies. If detector electronics 31 finds that, during the hardware over-etch time, the normalized signal does not match a clean chamber, hardware over-etch timer 68 is reset. Once detector electronics 31 has been satisfied for the entire hardware over-etch time, an additional signal, which may be only a single bit, referred to here as a "done bit 67", is sent to a cleaning program 55 signifying that the chamber is ready for subsequent steps in the cleaning program (e.g., further over-etch, seasoning, etc.). Detector electronics 31 may then be reset upon receipt of, e.g., an "enable bit" 72.

One further step may be performed by a software over-etch timer 71. Software over-etch timer 71 is similar to the above hardware over-etch timer 68, except that software over-etch timer 71 is instituted by the software of cleaning program 55 running on computer 50. Software over-etch 71 timer may be run either with or without hardware over-etch 68.

In use, after the last substrate on which a layer is to be deposited is removed from chamber 133, chamber 133 may be cleaned. The user establishes a flow of gas into chamber 133 from which a plasma will be created. One method of performing this cleaning is described in U.S. Patent Application entitled "Method for Reduced Cost Chamber Cleaning", assigned to the assignee of the present invention, filed on even date herewith, and incorporated herein by reference. In particular, in this embodiment, a flow of $NF_3$ is established. This may produce a range of pressures in chamber 133 of about 0.1 Torr to about 2.0 Torr, with a susceptor 135-gas face plate 122 spacing of about 500 mil to 2500 mil. It should also be noted that the plasma of gases may be formed either in-situ in chamber 133 or ex-situ in a remote plasma chamber. In the latter embodiment, gases from the remote plasma chamber enter chamber 133 from a separate valved inlet. More details of a remote plasma chamber may be found in U.S. patent application Ser. No. 08/707,491, filed Sep. 16, 1996, entitled "A Deposition Chamber Cleaning Technique Using a High Power Remote Excitation Source", assigned to the assignee of the present invention and incorporated herein by reference.

An RF power of about 1000 watts to about 4000 watts is applied to produce a plasma, corresponding to power densities of about 0.5 watts/cm2 to about 3 watts/cm2 of substrate area. Different deposited materials vary in the rates in which they may be cleaned or removed. For example, a plasma roughly within the energy range above cleans at a rate of about 3000 angstroms per minute to about 4000 angstroms per minute for a-Si, and at a rate of about 6000 angstroms per minute to about 7500 angstroms per minute for SiN.

Figure 3:
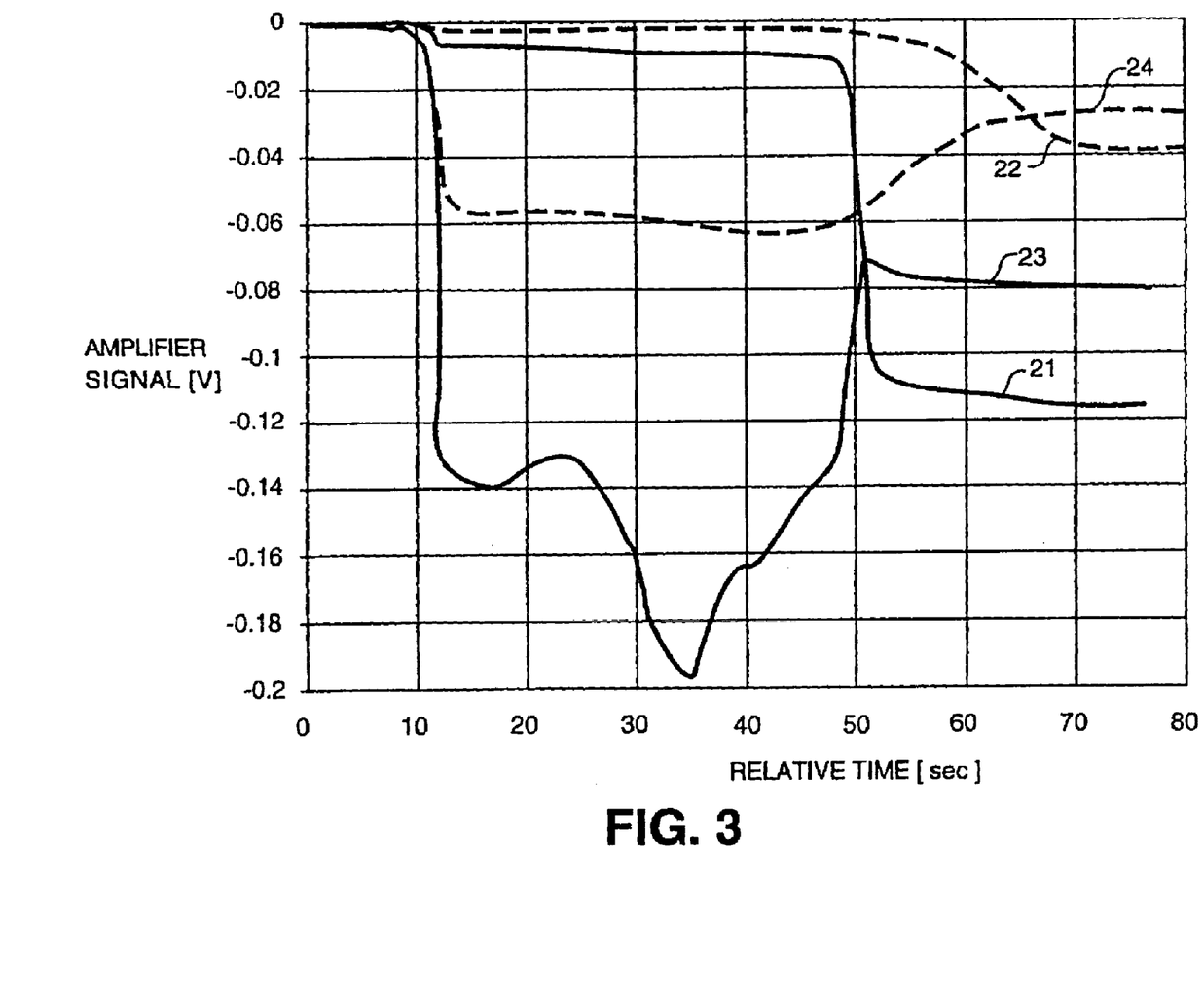
FIG. 3 is a graph of optoelectronic inverting preamplifier signals of fluorine and background emissions over time for the two different plasma powers.

As mentioned above, the F* emission line measured by first channel 33 will increase in intensity when the chamber is clean because less deposited material is available to react with the F* free fluorine radicals and thus the F* free fluorine radicals do not go into solution. FIG. 3 shows this rise in the F* signal for a film consisting of three cycles of 3500 angstroms of silicon nitride and 600 angstroms of a-Si. This "rise" is actually a "drop" in FIG. 3 because the voltage signals are inverted on that figure and on FIGS. 4–5. In particular, FIG. 3 shows the photodiode preamplifier inverted voltage signals, which are measured by photodetectors 30, for the 3000 watt 704 nm F* emission line signal 21 and for the background emission line signal 23. These signals are shown as functions of time for two different values of applied plasma power, 3000 watts and 1500 watts (the 1500 watt curves are dotted; the 1500 watt F* line is shown as curve 22, and the corresponding background line is curve 24). At about 50 seconds, F* signal 21 increases in intensity (for the case of the inverted preamplifier voltage, become more negative) until saturation. Because the F* signal 21 is increasing in intensity, the chamber pressure may be correspondingly increasing. In fact, in this example, the F* rise corresponds to a rise in chamber pressure to a range of about 0.25 Torr to about 0.45 Torr. The background emission signal 23, on the other hand, decreases (becomes less negative), until a saturation value is reached. The endpoint occurs when the two signals are each at saturation values (the saturation value for each signal is generally different). FIG. 3 shows that, regardless of plasma power, both sets of curves, 21 and 23 as well as 22 and 24, saturate at the endpoint, which appears to occur at somewhere between 50 and 75 seconds.

Figure 4:
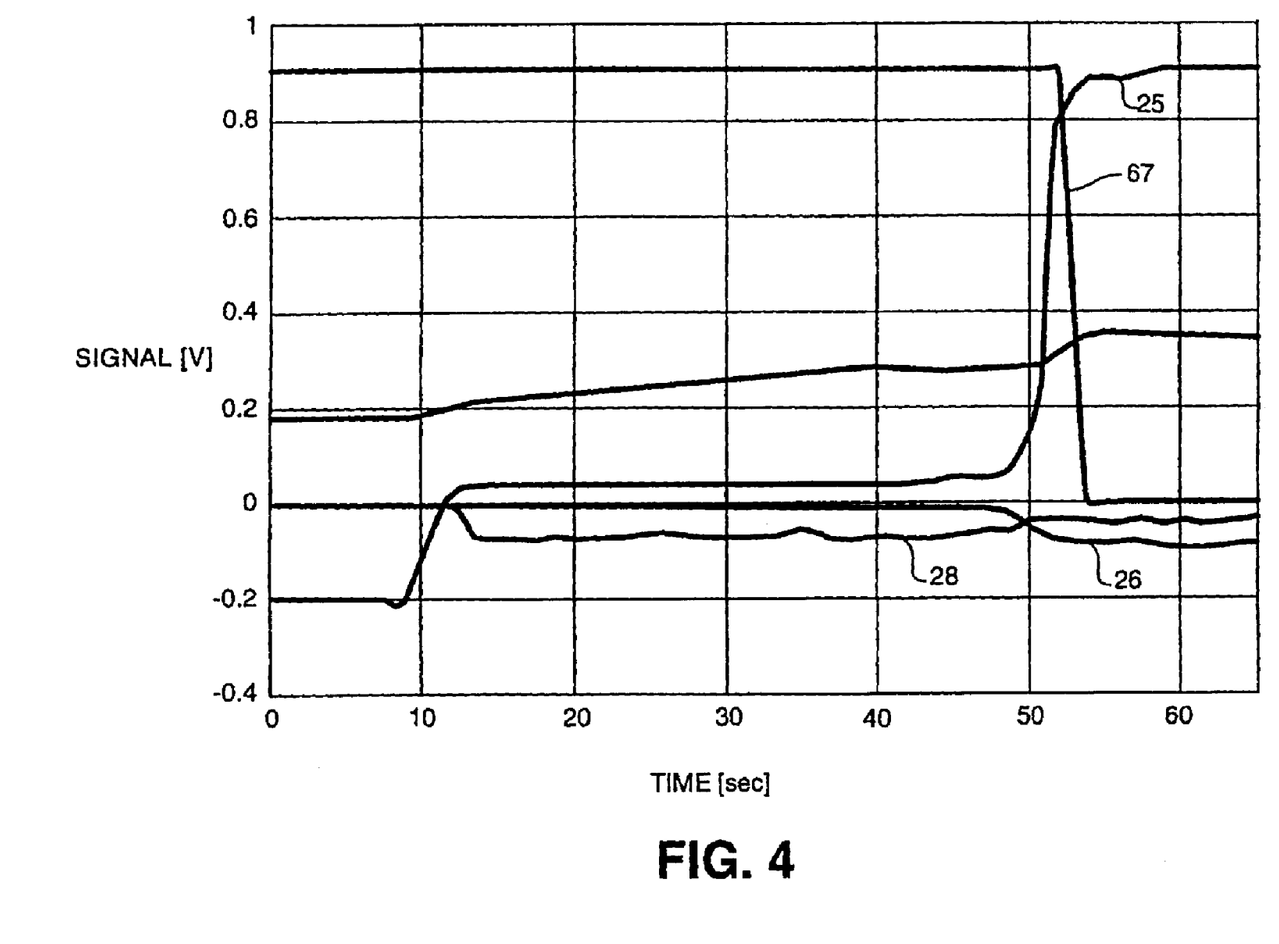
FIG. 4 is a graph of optoelectronic inverted signals of F* and background emissions, a normalized signal corresponding to the ratio of the above optoelectronic signals, an end bit signal, and an amplified chamber manometer signal, each over time.

FIG. 4 shows the photodiode preamplifier inverted voltage signals as a function of time for a similar film, though this film's a-Si layer is only 500 angstroms thick. Once again it is seen that F* signal 26 increases at the endpoint and background signal 28 decreases. Also clearly apparent is a rapid rise at the endpoint in the value of a normalized signal 25, which represents the ratio of the intensities of F* signal 26 and background signal 28. Normalized signal 25 is compared to a calibrated ratio of a "clean" chamber which may be set by the user. If normalized signal 25 is less than the calibrated ratio, then the endpoint has not yet been reached. If normalized signal 25 equals the calibrated ratio, the endpoint is reached. In FIG. 4, at approximately 53 sec, a jump is evident in normalized signal 25. The jump causes normalized signal 25 to be greater than the calibrated ratio and thus corresponds to the endpoint.

Once normalized signal 25 is greater than the threshold calibrated ratio, the endpoint is reached and hardware over-etch timer 68 in detector electronics 31 may be started which, as explained above, helps to ensure consistency of endpoint by eliminating spurious indications of endpoint due to pressure fluctuations, etc. This timer can be set by the user to be, e.g., 0, 2, 5, 10, or 15 sec. During this time, detector electronics 31 continues to check that normalized signal 25 is comparable to the threshold calibrated ratio. If the signals diverge, detector electronics 31 is reset to again wait for a proper signal matching. Once the hardware over-etch is successfully completed, detector electronics 31 changes the state of done bit 67 from "asserted" to "unasserted" or "high" to "low". In FIG. 4, this occurs at about 53 sec. The receipt of done bit 67 may in turn begin an additional software over-etch timer 71 in cleaning program 55. Following the period of this timer, subsequent cleaning steps or processing steps may be performed.

Figure 5:
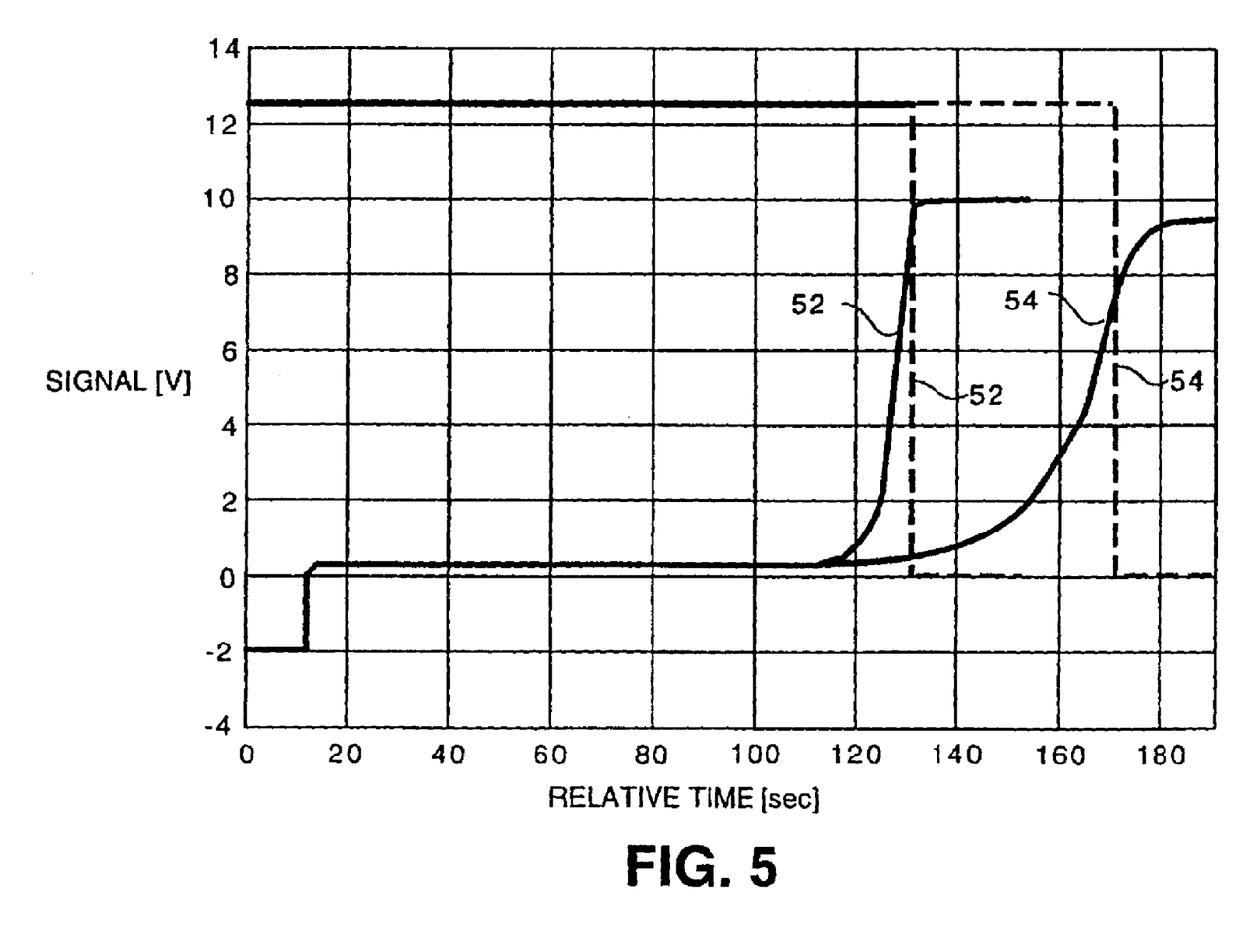
FIG. 5 is a graph of a normalized signal and an end bit signal for the two plasma powers of FIG. 3.

FIG. 5 shows the normalized signals for the data displayed in FIG. 3 where the cleaning method is used with two plasma powers. Curve 52 shows the normalized signal with a 3000 watt plasma and curve 54 shows the normalized signal with a 1500 watt plasma. Curve 54 is not as intense as curve 52 and the time to reach the endpoint is longer. Nevertheless, the level of the signal saturation is consistent. This shows that the method and apparatus of the invention can be advantageously used with plasmas of differing powers.

In a related feature, the method and apparatus of the invention can be used even when the detector inputs are less efficient. For example, it is often the case that the transparency of window 38 separating the detectors from chamber 133 changes as deposited films inadvertently buildup on window 38 (this efficiency change acts similarly to a change in plasma power). This does not prevent the method and apparatus of the invention from being useful because the signal saturation may still be effectively detected despite the changing transparency of the window.

Figure 6:
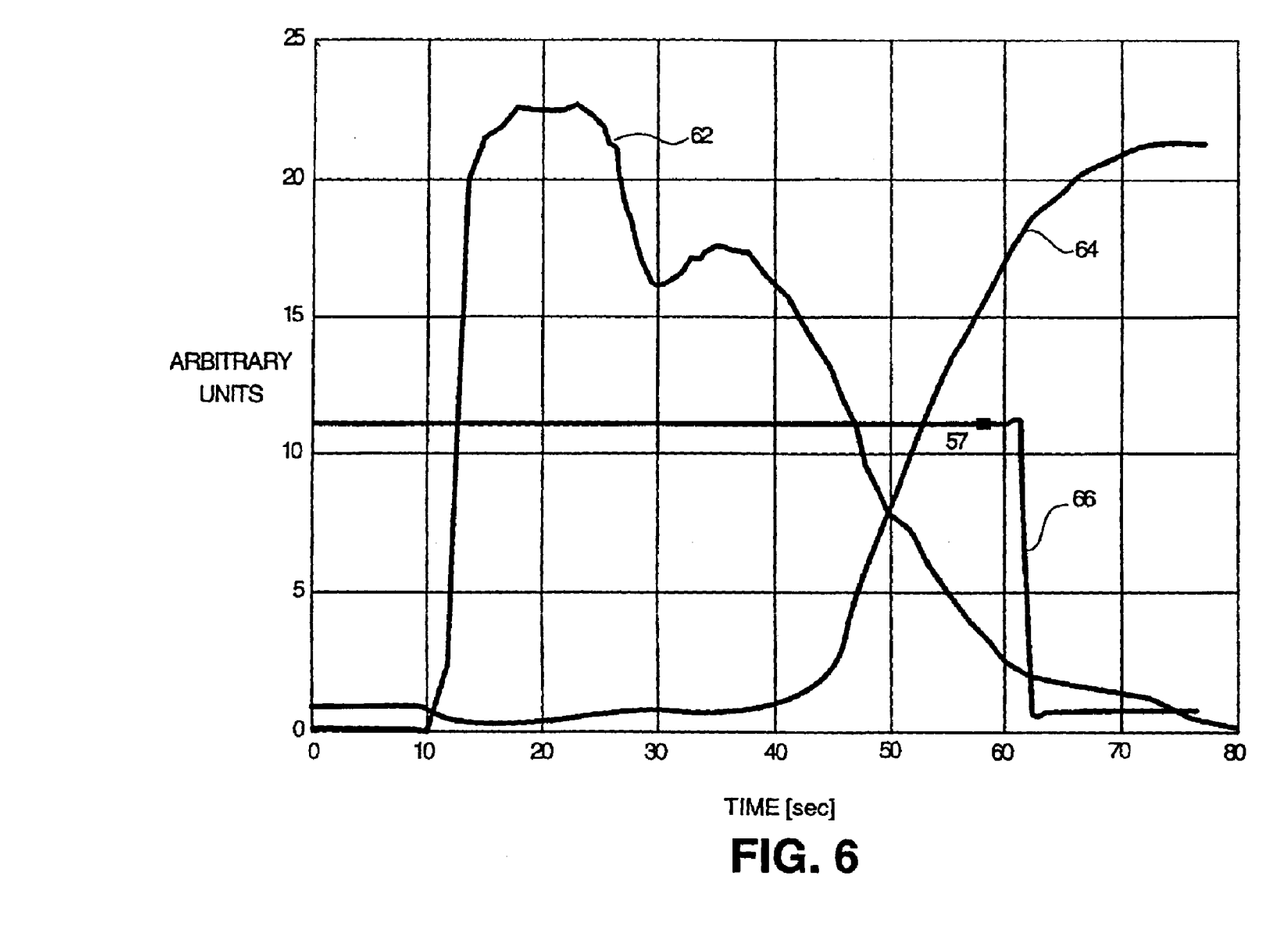
FIG. 6 is a graph of an end bit signal compared with various gas "intensities" obtained by a residual gas analyzer (RGA).

FIG. 6 shows intensity signals measured on a residual gas analyzer ("RGA") for the gas masses corresponding to fluorine (signal 62) and silicon fluoride ($SiF_3$, signal 64). Done bit signal 66 from detector electronics 31 is also shown. Unlike the signals in FIGS. 3–5, these signals are not inverted.

These RGA signals were measured as a check on the optoelectronic method discussed above. The y-axis has arbitrary units. The x-axis has units of seconds. The graph shows that fluorine signal 64 rises and silicon fluoride signal 62 falls such that they intersect at about 50 seconds. This intersection may be termed the "RGA endpoint". This intersection occurred just prior to the signal saturation and done bit 66 assertion, which appears to occur at about 62 seconds. Thus, the RGA endpoint approximately agrees with that determined by detector electronics 31. The precise point at which detector electronics 31 determined the endpoint, in this example, is shown as a square dot 57.

The above embodiment has been described with respect to certain gases. In particular, Ar has been used as the inert gas and $NF_3$ the cleaning gas. Other inert, noble and molecular gases may also be used, such as helium, neon, krypton, xenon, and molecular nitrogen, as well as other gases with similar properties. Moreover, other cleaning gases may also be used, such as $CF_4$, $C_2F_6$, and $SF_6$, as well as other gases with similar cleaning properties. Often these gases will contain fluorine.

The cleaning method may be used to clean a number of deposited films. For example, films of $Si_xO_y$, $Si_rN_s$, a-Si, polysilicon and SiON may all be removed by the invention.

The present invention has been described in terms of a preferred embodiment. The invention, however, is not limited to the embodiment depicted and described. Rather, the scope of the invention is defined by the appended claims.

We claim:

1. A method for cleaning a residue accumulated from a prior deposition from a wall within a deposition chamber, comprising the steps of:
   (a) flowing a cleaning gas into the deposition chamber;
   (b) forming a plasma of a cleaning gas within the deposition chamber so that at least a portion of the molecules of the cleaning gas are dissociated, wherein the plasma includes one or more reactive species that react with said residue on the wall;
   (c) monitoring the intensity of an emission line of a constituent of the partially dissociated cleaning gas;
   (d) monitoring the intensity of a background light emission in the chamber;
   (e) determining a ratio of the intensity of the cleaning gas emission line to the background emission;
   (f) monitoring the determined ratio over time;
   (g) comparing the determined ratio to a threshold value; and
   (h) controlling the flow of the cleaning gas based on the comparing step.

2. A method for cleaning a residue accumulated from a prior deposition from a wall within a deposition chamber, comprising the steps of:
   (a) flowing a cleaning gas into a plasma chamber;
   (b) forming a plasma of a cleaning gas within the plasma chamber so that at least a portion of the molecules of the cleaning gas are dissociated, wherein the plasma includes one or more reactive species that react with said residue on the wall;

(c) providing said plasma of the cleaning gas within the deposition chamber;

(d) monitoring the intensity of an emission line of a constituent of the partially dissociated cleaning gas in the deposition chamber;

(e) monitoring the intensity of a background light emission in the deposition chamber, (f) determining a ratio of the intensity of the cleaning gas emission line to the background emission;

(g) monitoring the determined ratio over time;

(h) comparing the determined ratio to a threshold value; and (i) controlling the flow of the cleaning gas based on the comparing step.

3. A method according to claim 2, wherein the plasma chamber and the deposition chamber are the same chamber, so that the plasma is formed in-situ in the deposition chamber.

4. A method for cleaning a residue accumulated from a prior deposition from a wall within a deposition chamber, comprising the steps of:

(a) providing a plasma of a cleaning gas within the deposition chamber so that at least a portion of the molecules of the cleaning gas are dissociated, wherein the plasma includes one or more reactive species that react with said residue on the wall;

(b) monitoring the intensity of an emission line of a constituent of the partially dissociated cleaning gas;

(c) monitoring the intensity of a background light emission in the chamber;

(d) determining a ratio of the intensity of the cleaning gas emission line to the background emission;

(e) monitoring the determined ratio over time;

(f) comparing the determined ratio to a threshold value; and (g) determining that the cleaning has reached an endpoint after the determined ratio exceeds the threshold value.

5. The method of claim 4, further comprising the step of:

before said providing step, performing within the deposition chamber a chemical vapor deposition process that deposits a film on an interior wall of the chamber; wherein said providing step is effective to remove said film.

6. The method of claim 4, wherein the step of monitoring the intensity of a background light emission comprises detecting the intensity of the emission line of at least one background gas.

7. The method of claim 4, wherein the step of monitoring the intensity of a background light emission comprises detecting the intensity of the emission lines of a plurality of background gases.

8. The method of claim 4, wherein the step of monitoring the intensity of a background light emission comprises detecting the intensity of the total background light emission.

9. The method of claim 4, wherein the step of monitoring the intensity of a background light emission comprises detecting the intensity of many different wavelengths.

10. The method of claim 4, wherein the step of monitoring the intensity of a background light emission comprises detecting the intensity of a range of wavelengths.

11. The method of claim 4, wherein the step of monitoring the intensity of a background light emission comprises coupling light from the interior of the chamber to a photodetector through a neutral density filter.

12. The method of claim 4, wherein:

the step of monitoring the intensity of an emission line of a constituent of the cleaning gas comprises coupling light from the interior of the chamber to a first photodetector through a first optical filter that transmits light only at the wavelength of said emission line of the cleaning gas; and the step of monitoring the intensity of a background light emission comprises coupling light from the interior of the chamber to a second photodetector through a broad band optical filter that transmits light at a wider band of wavelengths than the first optical filter.

13. The method of claim 4, further comprising the step of:

signalling that the cleaning process has completed after the determined ratio has exceeded the threshold value.

14. The method of claim 13, wherein the signalling step further comprises the step of:

after the determined ratio has exceeded the threshold value, monitoring the determined ratio during a waiting period before signalling that the cleaning process has completed.

15. The method of claim 4, wherein the providing step comprises the steps of:

forming a plasma of a cleaning gas in a remote plasma chamber distinct from the deposition chamber; and supplying plasma from the remote plasma chamber to the deposition chamber.

16. The method of claim 14, wherein the providing step comprises the step of forming the plasma of the cleaning gas in-situ within the deposition chamber.

17. A method for cleaning a residue accumulated from a prior deposition from a wall within a deposition chamber, comprising the steps of:

(a) providing a plasma of a cleaning gas within the deposition chamber so that at least a portion of the molecules of the cleaning gas are dissociated, wherein the plasma includes one or more reactive species that react with said residue on the wall;

(b) monitoring a first intensity of an emission line of a constituent of the partially dissociated cleaning gas;

(c) monitoring a second intensity of light transmitted from the interior of the chamber through a neutral density optical filter;

(d) determining a ratio of the first intensity to the second intensity;

(e) monitoring the determined ratio over time;

(f) comparing the determined ratio to a threshold value; and (g) determining that the cleaning has reached an endpoint after the determined ratio exceeds the threshold value.

18. A method for cleaning a residue accumulated from a prior deposition from a wall within a deposition chamber, comprising the steps of:

(a) providing a plasma of a cleaning gas within the deposition chamber so that at least a portion of the molecules of the cleaning gas are dissociated, wherein the plasma includes one or more reactive species that react with said residue on the wall;

(b) monitoring a first intensity of light transmitted from the interior of the deposition chamber through a first optical filter, wherein the first optical filter transmits light only at a characteristic wavelength of a constituent of said partially dissociated cleaning gas;

(c) monitoring a second intensity of light transmitted from the interior of the deposition chamber through a second optical filter, wherein the second optical filter transmits light over a wider range of wavelengths than the first optical filter;

(d) determining a ratio of the first intensity to the second intensity;

(e) monitoring the determined ratio over time;

(f) comparing the determined ratio to a threshold value; and (g) determining that the cleaning has reached an endpoint after the determined ratio exceeds the threshold value.

19. The method of claim 18, further comprising the step of:

before said providing step, performing within the deposition chamber a chemical vapor deposition process that deposits a film on an interior wall of the chamber;

wherein said providing step is effective to remove said film.

20. The method of claim 18, further comprising the step of:

signalling that the cleaning process has completed after the determined ratio has exceeded the threshold value.

21. The method of claim 20, wherein the signalling step further comprises the step of:

after the determined ratio has exceeded the threshold value, monitoring the determined ratio during a waiting period before signalling that the cleaning process has completed.

22. The method of claim 18, wherein the providing step comprises the steps of:

forming a plasma of a cleaning gas in a remote plasma chamber distinct from the deposition chamber; and supplying plasma from the remote plasma chamber to the deposition chamber.

23. The method of claim 18, wherein the providing step comprises the step of forming the plasma of the cleaning gas in-situ within the deposition chamber.

24. The method of claim 18, wherein the second optical filter is a neutral density filter.

* * * * *